United States Patent
Thomas et al.

(10) Patent No.: US 6,530,824 B2
(45) Date of Patent: Mar. 11, 2003

(54) METHOD AND COMPOSITION FOR POLISHING BY CMP

(75) Inventors: Terence M. Thomas, Newark, DE (US); Qianqiu Christine Ye, Wilmington, DE (US); Joseph K. So, Newark, DE (US); Wendy B. Goldberg, Wilmington, DE (US); Wade Godfrey, Landenberg, PA (US)

(73) Assignee: Rodel Holdings, Inc., Wilmington, DE (US)

(*) Notice: Subject to any disclaimer, the term of this patent is extended or adjusted under 35 U.S.C. 154(b) by 110 days.

(21) Appl. No.: 09/803,233

(22) Filed: Mar. 9, 2001

(65) Prior Publication Data

US 2002/0146965 A1 Oct. 10, 2002

(51) Int. Cl.$^7$ .................................................. B24B 1/00
(52) U.S. Cl. ............................ 451/41; 451/36; 438/692; 51/307
(58) Field of Search ............................ 451/41, 28, 36, 451/63, 285, 287, 288; 510/165, 167, 397; 51/307, 308, 309; 438/692, 693

(56) References Cited

U.S. PATENT DOCUMENTS

| | | | |
|---|---|---|---|
| 3,436,259 A | 4/1969 | Regh et al. | |
| 4,959,113 A | 9/1990 | Roberts | |
| 5,614,444 A | 3/1997 | Farkas et al. | |
| 5,676,587 A | 10/1997 | Landers et al. | |
| 5,773,364 A | 6/1998 | Farhas et al. | |
| 5,934,980 A | 8/1999 | Koos et al. | |
| 5,965,211 A | 10/1999 | Kondo et al. | |
| 6,063,306 A | 5/2000 | Kaufman et al. | |
| 6,066,028 A * | 5/2000 | Cheng et al. | 451/28 |
| 6,083,840 A | 7/2000 | Mravic et al. | |
| 6,110,011 A | 8/2000 | Somekh et al. | |
| 6,117,775 A * | 9/2000 | Kondo et al. | 438/690 |
| 6,143,155 A | 11/2000 | Adams et al. | |
| 6,194,317 B1 * | 2/2001 | Kaisaki et al. | 438/633 |
| 6,225,223 B1 * | 5/2001 | Liu et al. | 438/637 |
| 6,235,071 B1 * | 5/2001 | Tsuchiya et al. | 106/3 |
| 6,238,592 B1 * | 5/2001 | Hardy et al. | 252/79.1 |
| 6,258,140 B1 * | 7/2001 | Shemo et al. | 106/3 |
| 6,341,998 B1 | 1/2002 | Zhang | |
| 6,354,916 B1 | 3/2002 | Uzoh et al. | |

FOREIGN PATENT DOCUMENTS

GB        2 140 039 A        11/1984

OTHER PUBLICATIONS

Steigerwald, J. M.; Murarka, S. P.; Gutmann, R. J.; Duquette, D. J.; "Chemical Processes in the Chemical Mechanical Polishing of Copper"; Materials Chemistry and Physics, vol. 41, No. 3, Lausanne, Switzerland, Aug. 1995, pp. 217–228.

* cited by examiner

Primary Examiner—Joseph J. Hail, III
Assistant Examiner—David B. Thomas
(74) Attorney, Agent, or Firm—Anuradha Ramana; Blake T. Biederman

(57) ABSTRACT

A polishing composition for polishing a semiconductor wafer includes a source of chloride ions in solution, which reduces surface roughness of copper interconnects that are recessed in the wafer. High points on the copper interconnects are polished during a polishing operation, while the chloride ions migrate to electric fields concentrated at the high points. The chloride ions at the high points deter replating of copper ions from solution onto the high points. Instead the copper ions replate elsewhere on the interconnects, which reduces the surface roughness of the interconnects.

22 Claims, No Drawings

METHOD AND COMPOSITION FOR POLISHING BY CMP

BACKGROUND OF THE INVENTION

1. Field of the Invention

The invention pertains to polishing methods and slurry formulations used in the planarization of integrated circuit surfaces containing various films, most particularly those of a metal, a barrier or liner layer, and a dielectric layer on a semiconductor wafer.

2. Discussion of Related Art

U.S. Pat. No. 5,676,587 discloses a two-step polishing process to be used with Cu interconnect structures. The first step is designed to remove most of the overburden of Cu, and the second step is designed to remove the barrier or liner layer of Ta, TaN, Ti, or TiN. For the second step, a silica based slurry of near-neutral pH is detailed.

One of the problems resulting from polishing a semiconductor wafer by CMP, is that the copper interconnect structures, also known as interconnects, have a surface roughness that exceeds acceptable limits as specified by manufacturing standards. It has been recognized that an excessive surface roughness occurs from the rigors of CMP polishing. A need has existed for a process of polishing a semiconductor wafer that smoothes the surface roughness to acceptable limits. Further, a need has existed for a polishing composition for polishing a semiconductor wafer with interconnects having a surface roughness within acceptable limits.

SUMMARY OF THE INVENTION

The invention includes a method for polishing a semiconductor wafer, includes the steps of:

providing a fluid polishing composition with chloride ions, polishing a barrier layer on the semiconductor wafer with the fluid polishing composition to remove the barrier layer and to polish high points on copper interconnects and solublize copper ions in the polishing composition, and replating the copper ions from solution with the fluid polishing composition to smooth the surface of the copper interconnects, while the chloride ions migrate near the high points to deter replating of copper ions onto the high points.

By detering such copper replating from the high points, the surface of the copper interconnects become smoothed to have a surface roughness within acceptable limits as specified by manufacturing standards.

Further the invention includes a polishing composition for polishing a semiconductor wafer includes a source of chloride ions in solution that migrate to high points on copper interconnects that are below a polished surface of the semiconductor wafer to deter replating of copper ions from solution onto the high points.

Embodiments of the invention will now be described by way of example with reference to the following detailed description.

DETAILED DESCRIPTION

One of the requirements in the production of increasingly complex and dense semiconductor structures is the ability to planarize, without which ability, the complexity and density of the structures constructed on a semiconductor wafer are greatly limited. Chemical-Mechanical Planarization, or CMP, is an enabling technology in this area, since it has proved to be the most effective method to planarize surface films on semiconductor substrates.

While the first applications of CMP technology focused on the polishing of dielectric films (i.e., $SiO_2$), polishing of metal structures used for circuit interconnects is increasing rapidly. Along with the increase in metal planarization is an inherent increase in the number of different films that are simultaneously polished. Most metal structures contain three different films: a conductive metal layer, a barrier (or liner) layer between the conductive metal layer and the adjacent dielectric layer, and a dielectric layer. It is often desirable for the removal rates of each film to differ from each other in order to induce planarity and maintain the integrity of the semiconductor structure during polishing. In a typical metal structure, for example, if the entire planarization step were to take place in one step of polishing, it would typically be desirable to have high removal rates of material for the metal and barrier layers, while having low removal rates for the dielectric layer.

However, while it is desirable to limit the number of processing steps, there are often inherent difficulties associated with a one-step process that limit its usefulness. For example, copper interconnects, coupled with low-k dielectrics, have the potential (when compared to $Al/SiO_2$) to increase chip speed, reduce the number of metal layers required, minimize power dissipation, and reduce manufacturing costs. A typical copper interconnect structure contains a conductive copper film, a barrier layer of tantalum or tantalum nitride, and a dielectric layer of silicon dioxide. In one-step copper CMP, it is desirable to remove the Cu and Ta/TaN barrier layer as fast as possible, while removing the $SiO_2$ dielectric layer as slow as possible. However, this is often difficult, since the regimes in which Cu and Ta exhibit comparable removal rates often do not overlap. Also, it is critical to maintain the underlying semiconductor structure regardless of the removal rates of the various films. For the Cu CMP example, the removal of Cu within the interconnect features (called "dishing" or "recess") is undesirable since optimal electrical performance is obtained when as much of the conducting metal line as possible remains. Also, it is also desirable to minimize the removal of the $SiO_2$ dielectric layer within interconnect structures (called "erosion").

Farkas et al. in U.S. Pat. No. 5,773,364 presents the use of ammonium salts as oxidizers in metal CMP slurries. Farkas et al. in U.S. Pat. No. 5,614,444 discusses the use of materials with a polar and a polar component in silica-based slurries for the suppression of $SiO_2$ removal rate during metal CMP processes. The use of quaternary ammonium salts as an example of a cationic compound is listed.

U.S. Pat. No. 4,959,113 to Roberts discloses the use of metal chlorides and other metal salts as additives for polishing slurries.

According to an aspect of the invention, chloride ions will bond to a semiconductor surface, and is present as a mobile species able to rapidly move over the surface. These mobile species will equilibrate to specific sites to minimize the energy of the system. These same localized high surface energy sites are the sites where defects initiate. The presence of the chloride ions at these sites decreases the surface energy at these sites to make them essentially indistinguishable from the surface energy at any other site. The uniform surface energy negates localized non-uniform processes and variations in the surface condition of the wafer. Since this is a surface phenomenon, the amount of a compound providing chloride ions necessary to cause this negation of localized variations may be as low as 5 ppm. Preferably the amount of compound used is between 7 and 2000 ppm. Most preferably between 10 and 1000 ppm.

Addition of chloride ions to an aqueous solution composition used for CMP is particularly useful for semiconductor wafers comprising a metal, and is particularly effective when the metal is copper.

Compositions useful in polishing copper typically comprise a complexing agent providing copper ions in solution in the composition, such as citric acid; an inhibitor of initial corrosion, such as benzotriazole; and an organic polymer, such as polyvinyl pyrrolidone. Further, the composition includes an abrasive in the form of colloidal silica particles in fluid suspension, to be used with a polishing pad that is without abrasives. The abrasive is absent from the composition, such that the composition is abrasive free to be used with a polishing pad that itself has abrasives. Use of such additives in a polishing composition is disclosed in U.S. patent application, Ser. No. 09/420,682, filed Oct. 19, 2000, hereby incorporated by reference herein.

EXAMPLE

Compositions A and B were made comprising colloidal silica, citric acid, BTA (benzotriazole), and PVP (polyvinyl pyrrolidone). Further, composition B was made to include 5 to 10000 ppm, parts per million of ammonium chloride and 0.01% of ammonium perchlorate, all being in weight per cent. Patterned wafers comprising copper interconnects were polished on an IPEC Westech 372 polisher under standard conditions using compositions A and B. Surface roughness was measured using an AFM (Atomic Force Microscope) available from Digital Instruments, Inc. A Digital Instrument Dimension®5000 instrument using TappinMode® was used to determine PV (peak to valley roughness), RMS (root mean square roughness), and Ra (arithmetic average roughness). Table 1 below shows the roughness values obtained when the patterned wafers were polished with composition A and composition B.

TABLE 1

| Composition | Wafer Location | PV angstroms | RMS angstroms | Ra angstroms |
| --- | --- | --- | --- | --- |
| A | Center | 207.9 | 29.2 | 22.7 |
| A | Edge | 195.9 | 23.0 | 17.5 |
| A | Center | 302.7 | 26.8 | 17.6 |
| A | Edge | 229.3 | 28.4 | 21.2 |
| B | Center | 84.4 | 6.5 | 5.1 |
| B | Edge | 76.1 | 6.0 | 4.6 |

The table discloses the improvement in roughness when a small amount of chloride ions are added to a metal polishing composition. Improvement in roughness through the addition of a compound which provides chloride ions to a polishing composition has been found not only for a final step polishing, as shown in the Example above, but also for initial polishing of a semiconductor wafer comprising a metal.

The invention is useful in compositions which do not comprise any abrasive particles, such that they are abrasive free. Polishing with such compositions is usually carried out utilizing pads which comprise the abrasive particles, and are known as fixed abrasive polishing pads.

By way of example, first step polishing is performed, with a polishing pad and a polishing composition, according to a known CMP process to remove excess copper metal from an underlying barrier layer, while leaving patterned copper in a pattern of trenches below the polished surface of the barrier layer. The patterned copper provides the electrical circuit interconnects in the trenches.

However, first step polishing, especially as performed with rough abrasives, tends to leave the patterned copper with a surface roughness that exceeds allowable limits that are specified by manufacturing standards. Surface roughness can be considered as having high points on the surface of the patterned copper. Some of the high points can be quite sharp. Others are less sharp, but nonetheless, exceed the allowable limits for surface roughness. The surface roughness could have been avoided by providing chloride ions in the polishing composition that accompanies first step polishing. However, excessive surface roughness that results from first step polishing is reduced in roughness by performing second step polishing with a polishing composition containing chloride ions.

Such high points can be considered as being high energy areas, as in a situation wherein the patterned copper is wetted by the polishing composition and carries an electrical charge, resulting in an electrical field concentrating at the high points.

Following the first step polishing operation, second step polishing is performed by a known CMP process to remove the barrier layer from an underlying dielectric layer, and to leave the copper interconnects in the trenches that are recessed below a polished surface of the dielectric layer. According to the invention, chloride ions, provided in a fluid polishing composition, reduces surface roughness of the copper interconnects, such that the surface roughness is within the allowable limits.

Second step polishing by a known CMP process is performed with a fluid polishing composition that, either has an oxidizer that is selective to removal of the material forming the barrier layer and selective to removal of copper, or that is without an oxidizer that is selective to removal of copper while being selective to removal of the barrier layer. Further details of such fluid compositions are disclosed by U.S. patent application, Ser. No. 09/420,682, filed Oct. 19, 2000. Second step polishing is performed to remove the barrier layer by polishing action, and to a lesser extent, to remove high points of copper by the polishing action and provide copper ions that solublize, in solution with the fluid polishing composition.

When no oxidizer of copper is present in the fluid polishing composition that is to be used for polishing, either by first step polishing or by second step polishing, copper ions tend to migrate to the high energy areas that are present, and replate from solution to form unwanted nodules and/or dendrites. According to the invention, chloride ions are provided in the fluid polishing composition. The chloride ions tend to migrate to the high energy areas, and tend to null the electrical field and prevent replating of copper ions, and the formation of nodules and/or dendrites, on the high energy areas. The chloride ions replate evenly over the surface of the interconnects, which reduces the surface roughness to within acceptable limits.

During polishing, migration of the chloride ions to the high points, nulls the electrical field concentrated at the high energy areas, which deters the attraction of copper ions for replating from solution onto the high points on the patterned copper. Copper ions replate from solution in a distributed manner on the copper surface, and less preferably accumulate on the high points. Further, polishing with or without an oxidizer in the polishing composition, polishes the high points, and removes copper therefrom. Accordingly, polishing the high points serves to remove the high energy areas, such that copper ions replate from solution in a distributed manner, which contributes to smoothing the surface roughness to be within acceptable limits.

When an oxidizer, for example, a quantity of ammonium perchlorate, is present in the fluid polishing composition that is to be used for, either first step polishing or second step polishing, the oxidizer tends to oxidize the high points on the surface of the patterned copper. (Further, the oxidizer tends to oxidize spots of residual copper left behind on the underlying barrier layer when first step polishing has stopped prematurely.) Polishing removes oxidized copper from the high points, and, as known in the field of CMP polishing, removed oxide ions tend to remain in solution with the fluid polishing composition. The oxidizer contributes to removal of high points on the copper surface, which contributes to smoothing the surface roughness to be within acceptable limits. A balance is struck by the concentration of the oxidizer and the concentration of chloride ions, such that chloride ions are present in a concentration sufficient to be near to each of the high energy areas, and deter the attraction of copper ions for replating from solution onto the high energy areas.

The chloride ions in the polishing composition are mobile species of ions. When the surface of the patterned copper is sufficiently smooth, or has become smooth during a polishing operation, the high energy areas are substantially eliminated, and the chloride ions in the polishing composition are mobile and free of attraction to high energy areas. The mobile chloride ions are readily displaced by agitation away from the polished surface, which allows polishing to operate without interference by the chloride ions.

An invention resides in a method for polishing a semiconductor wafer, comprising the steps of: providing a fluid polishing composition with chloride ions, polishing a barrier layer on the semiconductor wafer with the fluid polishing composition to remove the barrier layer and to polish high points on copper interconnects and solublize copper ions in the polishing composition, and replating the copper ions from solution with the fluid polishing composition to smooth the surface of the copper interconnects, while the chloride ions migrate near the high points to deter replating of copper ions onto the high points. Although the invention has been described relative to second step polishing, the invention advantageously provides a process for a single step polishing operation with a polishing composition that is selective to removal of both copper and an underlying barrier layer, both of which is removed by polishing in a single step with the polishing composition according to the invention.

A method for CMP polishing of a semiconductor wafer comprised of a conductive metal interconnects, a barrier or liner film, and an underlying dielectric layer, wherein the method includes the following steps:

a) placing the semiconductor wafer in a chemical-mechanical polishing machine which comprises a polishing pad;

b) providing an aqueous composition at the interface between the polishing pad and the semiconductor wafer;

c) polishing the semiconductor wafer by providing relative motion between the polishing pad and the semiconductor wafer wherein the aqueous composition comprises 5 to 10,000 ppm of a compound which provides chloride ions in the composition.

Another aspect of the invention is a composition used in polishing a semiconductor wafer that is comprised of a conductive metal layer and interconnects, a barrier or liner film, and an underlying dielectric layer, wherein the composition comprises 5 to 10,000 ppm of a compound which provides chloride ions in the composition.

The compound may be any compound which provides chloride ions in the composition such as a chloride, chlorate, perchlorate, and hypochlorite.

Preferred embodiments of the invention having been described, other embodiments and modifications are intended to be covered by the spirit and scope of the appended claims.

What is claimed is:

1. A method for polishing a semiconductor wafer, comprising the steps of:

providing a fluid polishing composition, the fluid composition having chloride ions, polishing a barrier layer on the semiconductor wafer with the fluid polishing composition to remove the baffler layer and to polish high points of copper interconnects and to solubilize copper ions into a solution with the polishing composition, and replating the copper ions from the solution to smooth the surface of the copper interconnects, while the chloride ions migrate near the high points to deter replating of the copper ions from the solution onto the high points.

2. The method for polishing a semiconductor wafer, as recited in claim 1, wherein the step of providing the polishing composition with chloride ions includes solubilized ammonium chloride as a source of chloride ions.

3. The method for polishing a semiconductor wafer, as recited in claim 1, wherein the step of providing the fluid polishing composition includes an oxidizer that is selective to removal of copper; and the polishing occurs while the chloride ions migrate near the high points to deter replating of copper ions from the solution onto the high points.

4. The method for polishing a semiconductor wafer, as recited in claim 3, wherein the step of providing the fluid polishing composition with an oxidizer includes an ammonium perchlorate as the oxidizer.

5. The method for polishing a semiconductor wafer, as recited in claim 4, wherein the step of providing the polishing composition with chloride ions includes solubilized ammonium chloride as a source of chloride ions.

6. A polishing composition for polishing a semiconductor wafer, the composition comprising: a solution of a complexing agent for producing copper ions in solution in the polishing composition, and an inhibitor of corrosion, and a polymer and 5 to 2,000 ppm of a source of chloride ions that migrate to high points on copper interconnects that are below a polished surface of the semiconductor wafer to deter replating of copper ions onto the high points.

7. The polishing composition, as recited in claim 6, wherein, the source of chloride ions is ammonium chloride.

8. The polishing composition, as recited in claim 6, and further comprising:

an oxidizer that is selective to removal of copper while the chloride ions migrate to the high points on the copper interconnects to deter replating of copper ions onto the high points.

9. The polishing composition, as recited in claim 8, wherein the oxidizer is ammonium perchlorate.

10. The polishing composition, as recited in claim 9 wherein, the source of chloride ions is ammonium chloride.

11. A method for CMP polishing of a semiconductor wafer comprised of conductive metal interconnects, a baffler or liner film, and an underlying dielectric layer, comprising the steps of:

a) placing the semiconductor wafer in a chemical-mechanical polishing machine that includes a polishing pad;
b) providing an aqueous composition at the interface between the polishing pad and the semiconductor wafer, wherein the aqueous composition includes a compound that provides chloride ions;
c) polishing the semiconductor wafer by providing relative motion between the polishing pad and the semiconductor wafer to solubilize conductive metal ions into a solution with the polishing composition; and
d) replating the conductive metal ions from the solution to smooth the surface of the conductive metal interconnects, while the chloride ions migrate near the high points to deter replating of the conductive metal ions from the solution onto the high points.

12. The method according to claim 11 wherein the composition has 5 to 10,000 ppm of the compound.

13. The method according to claim 11 wherein the composition has 10 to 1,000 ppm of the compound.

14. The method according to claim 11 wherein the composition includes a complexing agent.

15. The method according to claim 11 wherein the composition includes an inhibitor.

16. The method according to claim 11 wherein the composition includes an organic polymer.

17. A composition used for polishing a semiconductor wafer comprised of conductive metal interconnects, a baffler or liner film and an underlying dielectric layer, wherein the composition comprises 5 to 2,000 ppm of a compound which provides chloride ions in the composition.

18. The composition according to claim 17 wherein the composition has 7 to 2,000 ppm of the compound.

19. The composition according to claim 17 wherein the composition has 10 to 1,000 ppm of the compound.

20. The composition according to claim 17 wherein the composition includes a complexing agent.

21. The composition according to claim 17 wherein the composition includes an inhibitor.

22. A composition according to claim 17 wherein the composition includes an organic polymer.

* * * * *